(12) United States Patent
Wan

(10) Patent No.: US 12,300,331 B2
(45) Date of Patent: May 13, 2025

(54) OPERATION METHOD OF MEMORY SYSTEM, MEMORY SYSTEM AND ELECTRONIC DEVICE

(71) Applicant: Yangtze Memory Technologies Co., Ltd., Hubei (CN)

(72) Inventor: Jie Wan, Hubei (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 105 days.

(21) Appl. No.: 18/091,174

(22) Filed: Dec. 29, 2022

(65) Prior Publication Data

US 2024/0176500 A1 May 30, 2024

(30) Foreign Application Priority Data

Nov. 29, 2022 (CN) .......................... 202211515079.2

(51) Int. Cl.
*G11C 16/34* (2006.01)
*G06F 3/06* (2006.01)
*G11C 11/56* (2006.01)
*G11C 16/04* (2006.01)
*G11C 16/26* (2006.01)
*G11C 29/50* (2006.01)

(52) U.S. Cl.
CPC ........ *G11C 16/3404* (2013.01); *G06F 3/0619* (2013.01); *G06F 3/0659* (2013.01); *G06F 3/0679* (2013.01); *G06F 3/0689* (2013.01); *G11C 11/5642* (2013.01); *G11C 11/5671* (2013.01); *G11C 16/0483* (2013.01); *G11C 16/26* (2013.01); *G11C 29/50004* (2013.01)

(58) Field of Classification Search
CPC .................................................. G11C 16/3404
See application file for complete search history.

(56) References Cited

U.S. PATENT DOCUMENTS

| 11,024,401 | B1 * | 6/2021 | Khayat | G11C 29/14 |
| 11,043,266 | B1 * | 6/2021 | Tagar | G11C 7/04 |
| 11,579,972 | B2 * | 2/2023 | Shin | G11C 11/5642 |
| 11,961,553 | B2 * | 4/2024 | Lee | G11C 16/26 |
| 2010/0177552 | A1 * | 7/2010 | Huang | G11C 5/147 |
| | | | | 365/189.011 |

(Continued)

*Primary Examiner* — Joseph D Torres
(74) *Attorney, Agent, or Firm* — Oblon, McClelland, Maier & Neustadt, L.L.P.

(57) ABSTRACT

An operation method of a memory system includes sending, by a controller, a first scanning command to a memory and determining a valley voltage by scanning a plurality of memory cells. The valley voltage is determined according to a count of memory cells corresponding to different threshold voltages in a preset threshold voltage interval, the count of memory cells corresponding to the different threshold voltages being obtained by scanning the plurality of memory cells, the valley voltage being a threshold voltage corresponding to the minimum count of memory cells in the threshold voltage interval. The operation method includes sending, by the controller, a first read command to the memory, the first read command being used for instructing the memory to use the valley voltage as a reference read voltage to read target data. The operation method also includes reading, by the memory, the target data according to the valley voltage.

20 Claims, 9 Drawing Sheets

(56) References Cited

U.S. PATENT DOCUMENTS

| | | | |
|---|---|---|---|
| 2014/0043903 A1* | 2/2014 | Ok | G11C 29/028 365/185.09 |
| 2014/0047269 A1* | 2/2014 | Kim | G11C 11/5642 714/16 |
| 2014/0269055 A1* | 9/2014 | Kurosawa | G11C 16/349 365/185.24 |
| 2016/0300609 A1* | 10/2016 | Han | G11C 16/26 |
| 2019/0066776 A1* | 2/2019 | Tamiya | G11C 11/5628 |

\* cited by examiner

OPERATION METHOD OF MEMORY SYSTEM, MEMORY SYSTEM AND ELECTRONIC DEVICE

CROSS REFERENCE TO RELATED APPLICATION

The present application claims priority to Chinese Patent Application No. 202211515079.2, "An operation method of memory system, memory system and electronic device", fled on Nov. 29, 2022. The entire disclosure of the application is hereby incorporated by reference in its entirety.

TECHNICAL FIELD

The present disclosure relates to the field of storage technologies, and in particular, to an operation method of a memory system, a memory system, and an electronic device.

BACKGROUND

A NAND flash memory has the advantages of non-volatility, large memory capacity, high process maturity, low cost, high programming and erasing operation rates and the like, thereby being applied in the industry more and more intensively.

Generally, read disturbance, temperature-variable read and high-temperature baking techniques in preparation processes may cause changes in the threshold voltages of some memory cells of the NAND flash memory. After the threshold voltages of some memory cells of the NAND flash memory change, reading target data stored in the NAND flash memory by using the default read voltage may result in failure to read the target data.

Therefore, it is desirable to address these and other deficiencies of current approaches.

SUMMARY

Implementations of the present disclosure provide an operation method of a memory system, a memory system, and an electronic device, which relate to the field of storage technologies.

In one aspect of the present disclosure, an operation method of a memory system is provided. The memory system includes a controller and a memory coupled with each other. The memory includes a plurality of memory cells. The method includes: sending, by the controller, a first scanning command to the memory and determining a valley voltage by scanning the plurality of memory cells. The valley voltage is determined according to counts of memory cells corresponding to different threshold voltages in a preset threshold voltage interval, the counts of memory cells corresponding to the different threshold voltages being obtained by scanning the plurality of memory cells, the valley voltage being a threshold voltage corresponding to the minimum count of memory cells in the threshold voltage interval. The operation method further includes sending, by the controller, a first read command to the memory, the first read command being used for instructing the memory to use the valley voltage as a reference read voltage to read target data. The operation method also includes reading, by the memory, the target data according to the valley voltage.

According to the operation method of the memory system provided in the implementations of the present disclosure, the controller sends the first scanning command to the memory, and determines the valley voltage by scanning the plurality of memory cells. Specifically, the counts of memory cells corresponding to the different threshold voltages are obtained by scanning the plurality of memory cells. The different threshold voltages are actual threshold voltages of the plurality of memory cells by scanning the plurality of memory cells. The threshold voltage corresponding to the minimum count of memory cells in the threshold voltage interval is determined as the valley voltage. The controller instructs the memory to use the valley voltage determined by scanning as a reference read voltage to read the target data, thereby improving the accuracy of the reference read voltage, and further improving the accuracy of reading the target data.

In some implementations, before sending, by the controller, the first scanning command to the memory, the method further includes: determining, by the controller, a read failure of the target data; and performing, by the controller, a plurality of read schemes sequentially, the plurality of read schemes including a read retry scheme, a soft decode read scheme, and an internal redundancy scheme RAID. In the above implementation, before sending the first scanning command to the memory, the controller performs the plurality of read schemes sequentially, thereby increasing the selectivity of reading the target data.

In some implementations, after determining, by the controller, that the memory successfully reads the target data according to the first read command, the method further includes: caching the determined valley voltage in the controller. In the above implementation, the controller caches the valley voltage, and when the controller needs to read the target data again, it may directly call the valley voltage to read the target data, thereby shortening the time for reading the target data, and improving the efficiency of reading the target data.

In some implementations, after the caching the determined valley voltage in the controller, the method further includes: calling, by the controller, the valley voltage, and sending a second read command to the memory, the second read command being used for instructing the memory to use the valley voltage as a reference read voltage to read the target data. In the above implementation, the controller directly calls the valley voltage and instructs the memory to use the valley voltage as the reference read voltage to read the target data, thereby shortening the time for reading the target data, and improving the efficiency of reading the target data.

In some implementations, after determining, by the controller, that the memory fails to read the target data according to the second read command, the method further includes: sending, by the controller, a second scanning command to the memory and re-determining a valley voltage by scanning the plurality of memory cells. In the above implementation, if the memory fails to read the target data according to the second read command, a valley voltage is re-determined by scanning the plurality of memory cells with the second scanning command, thereby improving the accuracy of the valley voltage. Furthermore, when the valley voltage is used as a reference read voltage to read the target data, the accuracy of reading the target data is improved.

In some implementations, the determining the valley voltage by scanning the plurality of memory cells includes: determining, by the memory, different scanning voltages according to the first scanning command, the different scanning voltages including threshold voltages of the plurality of memory cells; outputting, by the memory, scanning information to the controller according to the first scanning command, the scanning information including scanning data of the plurality of memory cells corresponding to the different threshold voltages; and determining, by the controller, the valley voltage according to the scanning data of the plurality of memory cells corresponding to the different threshold voltages. In the above implementation, the memory obtains the scanning data of the memory cells corresponding to the different threshold voltages by scanning the plurality of memory cells, wherein the different threshold voltages are the actual threshold voltages of the plurality of memory cells obtained by scanning the plurality of memory cells. The controller determines the valley voltage according to the scanning data of the plurality of memory cells corresponding to the different threshold voltages. The controller instructs the memory to use the valley voltage as the reference read voltage to read the target data. Thereby, the accuracy of the reference read voltage is improved. Furthermore, the accuracy of reading the target data is improved.

In some implementations, the determining, by the controller, the valley voltage according to the scanning data of the plurality of memory cells corresponding to the different threshold voltages includes: determining, by the controller, the counts of memory cells corresponding to the different threshold voltages according to the scanning data of the plurality of memory cells corresponding to the different threshold voltages; and determining, by the controller, a threshold voltage corresponding to the minimum count of memory cells in the preset threshold voltage interval as the valley voltage, according to the counts of memory cells corresponding to the different threshold voltages. In the above implementation, the controller determines the counts of memory cells corresponding to the different threshold voltages according to the scanning data of the plurality of memory cells corresponding to the different threshold voltages, and determines the threshold voltage corresponding to the minimum count of memory cells in the threshold voltage interval as valley voltage, and the controller instructs the memory to use the valley voltage as the reference read voltage to read the target data, thereby improving the accuracy of the reference read voltage, and furthermore, improving the accuracy of reading the target data.

In another aspect of the present disclosure, an operation method of a memory system is provided, the memory system includes a controller and a memory coupled with each other, the memory including a plurality of memory cells, and the method includes: determining, by the controller, a read failure of target data; performing, by the controller, a plurality of read schemes sequentially, the plurality of read schemes comprising a read retry scheme, a soft decode read scheme, and an internal redundancy scheme RAID, after performing the internal redundancy scheme RAID, sending, by the controller, a first scanning command to the memory and determining a valley voltage by scanning the plurality of memory cells, wherein the valley voltage is determined according to counts of memory cells corresponding to different threshold voltages in a preset threshold voltage interval, the counts of memory cells corresponding to the different threshold voltages being obtained by scanning the plurality of memory cells, and the valley voltage being a threshold voltage corresponding to the minimum count of memory cells in the threshold voltage interval; sending, by the controller, a first read command to the memory, the first read command being used for instructing the memory to use the valley voltage as a reference read voltage to read the target data; and reading, by the memory, the target data according to the valley voltage.

According to the operation method of the memory system provided in the implementations of the present disclosure, after determining the read failure of the target data according to a default read voltage, the controller performs the plurality of read schemes sequentially, sends the first scanning command the memory, and determines the valley voltage by scanning the plurality of memory cells. Specifically, the counts of memory cells corresponding to the different threshold voltages are obtained by scanning the plurality of memory cells, wherein the different threshold voltages are actual threshold voltages of the plurality of memory cells obtained by scanning the plurality of memory cells, the threshold voltage corresponding to the minimum count of memory cells in the threshold voltage interval is determined as the valley voltage, and the controller instructs the memory to use the valley voltage determined by scanning as the reference read voltage to read the target data, thereby improving the accuracy of the reference read voltage, and furthermore, improving the accuracy of reading the target data.

In some implementations, after determining, by the controller, that the memory successfully reads the target data according to the first read command, the method further includes: caching the determined valley voltage in the controller In some implementations, after the caching the determined valley voltage in the controller, the method further includes: calling, by the controller, the valley voltage, and sending a second read command to the memory, the second read command being used for instructing the memory to use the valley voltage as a reference read voltage to read the target data.

In some implementations, after determining, by the controller, that the memory fails to read the target data according to the second read command, the method further includes: sending, by the controller, a second scanning command to the memory and re-determining a valley voltage by scanning the plurality of memory cells.

In some implementations, the determining the valley voltage by scanning the plurality of memory cells includes: determining, by the memory, different scanning voltages according to the first scanning command, the different scanning voltages including threshold voltages of the plurality of memory cells; outputting, by the memory, scanning information to the controller according to the first scanning command, the scanning information including scanning data of the plurality of memory cells corresponding to the different threshold voltages; and determining, by the controller, the valley voltage according to the scanning data of the plurality of memory cells corresponding to the different threshold voltages.

In some implementations, determining, by the controller, the valley voltage according to the scanning data of the plurality of memory cells corresponding to the different threshold voltages includes: determining, by the controller, the counts of memory cells corresponding to the different threshold voltages according to the scanning data of the plurality of memory cells corresponding to the different threshold voltages; and determining, by the controller, a threshold voltage corresponding to the minimum count of memory cells in the preset threshold voltage interval as the valley voltage, according to the counts of memory cells corresponding to the different threshold voltages.

In yet another aspect of the present disclosure, a memory system is provided, which includes a controller and a memory coupled with each other, the memory including a plurality of memory cells. The controller is configured to send a first scanning command to the memory and determine a valley voltage by scanning the plurality of memory cells. The valley voltage is determined according to counts of memory cells corresponding to different threshold voltages in a preset threshold voltage interval, the counts of memory cells corresponding to the different threshold voltages being obtained by scanning the plurality of memory cells, the valley voltage being a threshold voltage corresponding to the minimum count of memory cells in the threshold voltage interval. The controller is further configured to send a first read command to the memory, the first read command being used for instructing the memory to use the valley voltage as a reference read voltage to read target data. The memory is configured to read the target data according to the valley voltage.

In some implementations, the controller is further configured to: determine a read failure of the target data before sending the first scanning command to the memory; and perform a plurality of read schemes sequentially, the plurality of read schemes including a read retry scheme, a soft decode read scheme, and an internal redundancy scheme RAID.

In some implementations, the controller is further configured to: after determining that the memory successfully reads the target data according to the first read command, cache the determined valley voltage.

In some implementations, the controller is further configured to: after the caching the determined valley voltage, call the valley voltage and send a second read command to the memory, the second read command being used for instructing the memory to use the valley voltage as a reference read voltage to read the target data.

In some implementations, the controller is further configured to: after determining that the memory fails to read the target data according to the second read command, send a second scanning command to the memory and re-determine a valley voltage by scanning the plurality of memory cells.

In some implementations, the memory is further configured to determine different scanning voltages according to the first scanning command, the different scanning voltages including threshold voltages of the plurality of memory cells. The memory is further configured to output scanning information to the controller according to the first scanning command, the scanning information including scanning data of the plurality of memory cells corresponding to the different threshold voltages. The controller is further configured to determine the valley voltage according to the scanning data of the plurality of memory cells corresponding to the different threshold voltages.

In some implementations, the controller is configured to: determine the counts of memory cells corresponding to the different threshold voltages according to the scanning data of the plurality of memory cells corresponding to the different threshold voltages; and determine a threshold voltage corresponding to the minimum count of memory cells in the preset threshold voltage interval as the valley voltage, according to the counts of memory cells corresponding to the different threshold voltages.

In yet another aspect of the present disclosure, a memory system is provided, which includes a controller and a memory coupled with each other, the memory comprising a plurality of memory cells. The controller is configured to determine a read failure of target data. The controller is further configured to perform a plurality of read schemes sequentially, the plurality of read schemes including a read retry scheme, a soft decode read scheme, and an internal redundancy scheme RAID. The controller is further configured to: after performing the internal redundancy scheme RAID, send a first scanning command to the memory and determine a valley voltage by scanning the plurality of memory cells. The valley voltage is determined according to counts of memory cells corresponding to different threshold voltages in a preset threshold voltage interval, the counts of memory cells corresponding to the different threshold voltages being obtained by scanning the plurality of memory cells, the valley voltage being a threshold voltage corresponding to the minimum count of memory cells in the threshold voltage interval. The controller is further configured to send a first read command to the memory, the first read command being used for instructing the memory to use the valley voltage as a reference read voltage to read the target data. The memory is configured to read the target data according to the valley voltage.

In some implementations, the controller is further configured to: after determining that the memory successfully reads the target data according to the first read command, cache the determined valley voltage.

In some implementations, the controller is further configured to: after caching the determined valley voltage, call the valley voltage and send a second read command to the memory, the second read command being used for instructing the memory to use the valley voltage as a reference read voltage to read the target data.

In some implementations, the controller is further configured to: after determining that the memory fails to read the target data according to the second read command, send a second scanning command to the memory and re-determine a valley voltage by scanning the plurality of memory cells.

In some implementations, the memory is further configured to determine different scanning voltages according to the first scanning command, the different scanning voltages including threshold voltages of the plurality of memory cells. The memory is further configured to output scanning information to the controller according to the first scanning command, the scanning information including scanning data of the plurality of memory cells corresponding to the different threshold voltages. The controller is further configured to determine the valley voltage according to the scanning data of the plurality of memory cells corresponding to the different threshold voltages.

In some implementations, the controller is configured to: determine the counts of memory cells corresponding to the different threshold voltages according to the scanning data of the plurality of memory cells corresponding to the different threshold voltages; and determine a threshold voltage corresponding to the minimum count of memory cells in the preset threshold voltage interval as the valley voltage, according to the counts of memory cells corresponding to the different threshold voltages.

In yet another aspect, a controller is provided. The controller is used for coupling with a memory, the memory including a plurality of memory cells. The controller is configured to: send a first scanning command to the memory and determine a valley voltage by scanning the plurality of memory cells. The valley voltage is determined according to counts of memory cells corresponding to different threshold voltages in a preset threshold voltage interval, the counts of memory cells corresponding to the different threshold voltages being obtained by scanning the plurality of memory cells, the valley voltage being a threshold voltage corresponding to the minimum count of memory cells in the threshold voltage interval. The controller is configured to send a first read command to the memory, the first read command being used for instructing the memory to use the valley voltage as a reference read voltage to read target data. The controller is configured to receive the target data output by the memory.

In some implementations, the controller is further configured to: before sending the first scanning command to the memory, determine a read failure of the target data; and perform a plurality of read schemes sequentially, the plurality of read schemes including a read retry scheme, a soft decode read scheme, and an internal redundancy scheme RAID.

In some implementations, the controller is further configured to: after determining that the memory successfully reads the target data according to the first read command, cache the determined valley voltage.

In some implementations, the controller is further configured to: after caching the determined valley voltage, call the valley voltage and send a second read command to the memory, the second read command being used for instructing the memory to use the valley voltage as a reference read voltage to read the target data.

In some implementations, the controller is further configured to: after determining that the memory fails to read the target data according to the second read command, send a second scanning command to the memory and re-determine a valley voltage by scanning the plurality of memory cells.

In some implementations, the controller is configured to: receive scanning information output by the memory according to the first scanning command, the scanning information including scanning data of the plurality of memory cells corresponding to the different threshold voltages. Different scanning voltages are determined by the memory according to the first scanning command, and the different scanning voltages includes the threshold voltages of the plurality of memory cells. The controller is configured to determine the valley voltage according to the scanning data of the plurality of memory cells corresponding to the different threshold voltages.

In some implementations, the controller is further configured to: determine the counts of memory cells corresponding to the different threshold voltages according to the scanning data of the plurality of memory cells corresponding to the different threshold voltages; and determine a threshold voltage corresponding to the minimum count of memory cells in the preset threshold voltage interval as the valley voltage, according to the counts of memory cells corresponding to the different threshold voltages.

In yet another aspect of the present disclosure, a controller is provided. The controller is used for coupling with a memory, the memory including a plurality of memory cells. The controller is configured to: determine a read failure of target data; perform a plurality of read schemes sequentially, the plurality of read schemes including a read retry scheme, a soft decode read scheme, and an internal redundancy scheme RAID; after performing the internal redundancy scheme RAID, send a first scanning command to the memory and determine a valley voltage by scanning the plurality of memory cells, wherein the valley voltage is determined according to counts of memory cells corresponding to different threshold voltages in a preset threshold voltage interval, the counts of memory cells corresponding to the different threshold voltages being obtained by scanning the plurality of memory cells, and the valley voltage being a threshold voltage corresponding to the minimum count of memory cells in the threshold voltage interval; send a first read command to the memory, the first read command being used for instructing the memory to use the valley voltage as a reference read voltage to read the target data; and receive the target data output by the memory.

In some implementations, the controller is further configured to: after determining that the memory successfully reads the target data according to the first read command, cache the determined valley voltage.

In some implementations, the controller is further configured to: after the caching the determined valley voltage, call the valley voltage and send a second read command to the memory, the second read command being used for instructing the memory to use the valley voltage as a reference read voltage to read the target data.

In some implementations, the controller is further configured to: after determining that the memory fails to read the target data according to the second read command, send a second scanning command to the memory and re-determine a valley voltage by scanning the plurality of memory cells.

In some implementations, the controller is configured to: receive scanning information output by the memory according to the first scanning command, the scanning information including scanning data of the plurality of memory cells corresponding to the different threshold voltages, wherein different scanning voltages are determined by the memory according to the first scanning command, and the different scanning voltages includes the threshold voltages of the plurality of memory cells; and determine the valley voltage according to the scanning data of the plurality of memory cells corresponding to the different threshold voltages.

In some implementations, the controller is further configured to: determine the counts of memory cells corresponding to the different threshold voltages according to the scanning data of the plurality of memory cells corresponding to the different threshold voltages; and determine a threshold voltage corresponding to the minimum count of memory cells in the preset threshold voltage interval as the valley voltage, according to the counts of memory cells corresponding to the different threshold voltages.

In yet another aspect of the present disclosure, an electronic device is provided, which includes a host and a memory system provided in the foregoing several aspects. The host is connected to the memory system to write data into the memory system or read data stored in the memory system.

In yet another aspect of the present disclosure, a computer-readable memory medium is provided. The computer-readable memory medium includes computer instructions, when running on the memory system provided in the foregoing several aspects, the computer instructions cause the memory system provided in the foregoing several aspects to perform the operation method of the memory system provided in the foregoing several aspects.

In yet another aspect of the present disclosure, a computer program product containing instructions is provided. When running on the memory system provided in the foregoing several aspects, the computer program product causes the memory system provided in the foregoing several aspects to perform the operation method of the memory system provided in the foregoing several aspects.

BRIEF DESCRIPTION OF THE DRAWINGS

To illustrate technical solutions in the present disclosure more clearly, a brief introduction on the drawings, which are needed in some implementations of the present disclosure, will be given below. Apparently, the drawings in the description below are merely drawings of some implementations of the present disclosure, based on which other drawings may be obtained by those ordinary skilled in the art. In addition, the drawings in the following description may be regarded as schematic diagrams, and are not intended to limit the actual sizes of products, the actual processes of methods, the actual timing of signals and the like involved in the implementations of the present disclosure.

DETAILED DESCRIPTION

Figure 1:
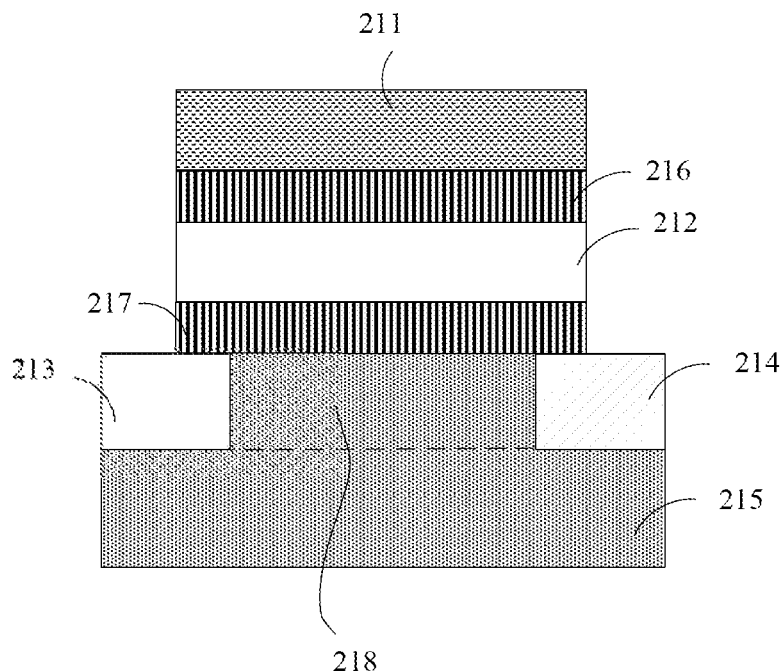
FIG. 1 is a schematic structural diagram of a charge trapping transistor according to some implementations of the present disclosure.

A clear and complete description of technical solutions in some implementations of the present disclosure will be given below, in combination with the drawings. Apparently, the implementations described below are merely a pan, but not all, of the implementations of the present disclosure. All other implementations, obtained by those ordinary skilled in the art based on the implementations provided in the present disclosure, fall into the protection scope of the present disclosure.

Unless required in the context otherwise, throughout the specification and claims, the term "include" is interpreted as an open and inclusive meaning, that is, "including, but not limited to". In the description of the specification, the terms "one implementation", "some implementations", "exemplary implementations", "exemplarily" or "some examples" and the like are intended to indicate that particular features, structures, materials or characteristics related to the implementations or examples are included in at least one implementation or example of the present disclosure. The schematic representation of the above terms does not necessarily refer to the same implementation or example. Furthermore, the particular features, structures, materials or characteristics may be included in any one or more implementations or examples in any suitable manner.

The terms "first" and "second" are used for descriptive purposes only and shall not be understood as indicating or implying relative importance or implicitly indicating the number of indicated technical features. Thus, the features defined with "first" and "second" may explicitly or implicitly include one or more of the features. In the description of the implementations of the present disclosure, unless otherwise specified, the meaning of "a plurality of" is two or more.

The use of "applicable to" or "configured to" herein means an open and inclusive language, which does not exclude devices applicable to or configured to perform additional tasks or steps.

In addition, the use of "based on" means opening and inclusiveness, this is because processes, steps, computations or other actions "based on" one or more of the conditions or values may be based on additional conditions or beyond the values in practice.

The term "three-dimensional memory" refers to a semiconductor device formed by memory cell transistor strings (referred to herein as "memory cell strings", such as NAND memory cell strings), which are disposed in an array on the primary surface of a substrate or a source layer and extended in a direction vertical to the substrate or the source layer. As used herein, the term "vertical/vertically" means nominally vertical to the primary surface (i.e., lateral surface) of the substrate or the source layer.

Before introducing the implementations of the present disclosure, relevant knowledge of the NAND flash memory is first described.

A minimum write unit of the NAND flash memory is a page, and each page may include a plurality of memory cells, for example, one page may include 4000 memory cells. One block includes a plurality of pages, for example, in general, one block may include 64 pages, or one block may include 128 pages. Flash memory erasure is performed in units of blocks, while writing is typically performed in units of pages.

For each memory cell of the plurality of memory cells of the NAND flash memory, the memory cell may be a charge trapping transistor. A structure of the charge trapping transistor is similar with a structure of a metal-oxide-semiconductor field-effect transistor (MOSFET), and the difference lies in that a charge trapping layer is inserted into a gate oxide dielectric layer of the MOSFET in the charge trapping transistor, so that the charge trapping layer is used for storing charges. In some implementations, the memory cell may also be a floating gate transistor, the floating gate transistor inserts an additional floating gate (referred to as a floating gate for short) in the gate oxide dielectric layer of the MOSFET, such that the floating gate is used for storing charge. The floating gate transistor has two gates (a conventional control gate and a floating gate). The floating gate transistor differs from the charge trapping transistor in that the materials for charge storage are different, for example, the floating gate transistor stores charges by using the floating gate, and the floating gate is a conductor, so the charges may move freely in the floating gate; and the charge trapping transistor uses the charge trapping layer to store charges, and the charge trapping layer is an insulator, for example, the charge trapping layer may be of silicon nitride, so the charges are not suitable for moving in the charge trapping layer.

The structure of the floating gate transistor is similar with the structure of the charge trapping transistor. Exemplarily, a specific structure of the charge trapping transistor is described by taking an example that the memory cells of the NAND flash memory are charge trapping transistors. Referring to FIG. 1, FIG. 1 illustrates a schematic structural diagram of a charge trapping transistor, which includes a control gate 211, a charge trapping layer 212, a source 213, a drain 214, a substrate 215, an oxide layer 216, and a tunnel oxide layer 217. The source 213 and the drain 214 are disposed on the substrate 215. An N-channel charge trapping transistor is taken as an example in an implementation of the present disclosure. The substrate 215 is of a P-type semiconductor material, and the source 213 and the drain 214 are of an N-type semiconductor material. The substrate material between the source 213 and the drain 214 may form a conductive channel 218. The charge trapping layer 212 covers the conductive channel 218. The tunnel oxide layer 217 is disposed between the charge trapping layer 212 and the conductive channel 218, to separate the charge trapping layer 212 from the source 213, the drain 214, and the conductive channel 218. The control gate 211 is disposed on the charge trapping layer 212. The oxide layer 216 is disposed between the control gate 211 and the charge trapping layer 212, to separate the control gate 211 from the charge trapping layer 212. Both the oxide layer 216 and the tunnel oxide layer 217 are made of an insulating material, for example, silicon dioxide ($SiO_2$).

By biasing a positive (negative) voltage on the gate of an N-channel MOSFET and inducing a negative (positive) charge between the source and drain channels, a conductive channel between the source and the drain may be opened (closed). The voltage for opening the conductive channel between the source and the drain is called a threshold voltage ($V_{th}$). A charge trapping transistor is formed by inserting a charge trapping layer into the gate oxide dielectric layer. The charge trapping layer may trap and store electrons, and since the charge trapping layer has no external loop and the electrons in the charge trapping layer cannot move freely, even after power down, the electrons will not be lost. The number of electrons trapped in the charge trapping layer may change the threshold voltage of the charge trapping transistor, and based on such characteristics, the charge trapping transistor may be used for storing data.

For the charge trapping transistor, when electrons are injected onto the charge trapping layer, due to the shielding effect of electrons, a higher threshold voltage is required to open the conductive channel. If the threshold voltage in the case where no electrons are injected into the charge trapping layer is denoted as $V_{th1}$, the threshold voltage in the case where electrons exist in the charge trapping layer is denoted as $V_{th2}$, then assuming to use a voltage greater than $V_{th1}$ but less than $V_{th2}$ to attempt to open the charge trapping transistor, if the charge trapping transistor is opened, then it may be determined that no electrons are injected into the charge trapping layer, otherwise if the charge trapping transistor is not opened, then it may be determined that electrons are injected into the charge trapping layer. Based on such logic, when electrons are trapped on the charge trapping layer, the charge trapping transistor is in an open state, representing 1; when no electrons are trapped on the charge trapping layer, the charge trapping transistor is in a closed state, representing 0. Therefore, data may be stored by using such different states, and a storage function is achieved by injecting electrons onto the charge trapping layer to change the threshold voltages.

Exemplarily, with continued reference to FIG. 1, a high voltage is applied to the control gate 211 of the charge trapping transistor, so that a potential difference is formed between the control gate 211 and the conductive channel 218 to attract electrons, and the attracted electrons undergo a "Fowler Nordheim (Fn)" tunneling effect based on the potential difference between the control gate 211 and the conductive channel 218, that is, the attracted electrons pass through the tunnel oxide layer 217 and enter the charge trapping layer 212, and the electrons are trapped by the charge trapping layer 212. Once the electrons are trapped by the charge trapping layer 212, it is difficult to lose the electrons because the charge trapping layer 212 has no loop with the outside. The electrons trapped by the charge trapping layer 212 may be released if a high voltage is applied in the opposite direction, that is, a high voltage is applied to the substrate 215, thereby reducing the number of electrons within the charge trapping layer 212.

Based on the number of bits that each memory cell of the NAND flash memory may store, the NAND flash memory may be divided into several types, such as a single-level cell (SLC) flash memory, a multi-level cell (MLC) flash memory, a triple-level cell (TLC) flash memory, a quad-level cell (QLC) flash memory and the like. The number of read voltages corresponding to different types of flash memories are different as well.

Figure 2:
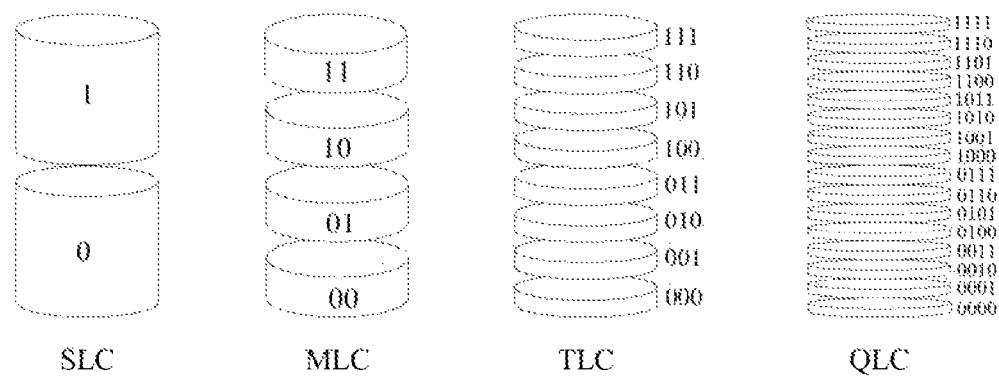
FIG. 2 is a schematic diagram of data storage of a charge trapping transistor according to some implementations of the present disclosure.

Exemplarily, in combination with FIG. 2, the memory cell of the SLC flash memory stores different data according to the presence or absence of electrons in the charge trapping layer, which correspond to two different data states. Each memory cell may be used for storage of 1 bit of data, for example, the state without electrons in the charge trapping layer is stored as 0, and the state with electrons in the charge trapping layer is stored as 1, where the SLC flash memory has one read voltage.

The memory cells of each of the MLC flash memory, the TLC flash memory, and the QLC flash memory store different data according to the number of electrons trapped in the charge trapping layer. For example, the number of electrons in the charge trapping layer of the memory cell of the MLC flash memory has four states: high, medium, low, and no, which correspond to the four different data states. Each memory cell may be used for storage of 2 bits of data, for example, each memory cell may be used for storing one of the four data states of 00, 01, 10, and 11, wherein the MLC flash memory has three read voltages.

The number of electrons in the charge trapping layer of the memory cell of the TLC flash memory has eight states, which correspond to eight different data states. Each memory cell may be used for storage of 3 bits of data, for example, each memory cell may be used for storing one of the eight data states of 000, 001, 010, 011, 100, 101, 110, and 111, wherein the TLC flash memory has seven read voltages.

The number of electrons in the charge trapping layer of the memory cell of the QLC flash memory has sixteen states, which correspond to sixteen different data states. Each memory cell may be used for storage of 4 bits of data, for example, each memory cell may be used for storing one of the sixteen data states of 0000, 0001, 0010, 0011, 0100, 0101, 0110, 0111, 1000, 1001, 1010, 1011, 1100, 1101, 1110, and 1111, wherein the QLC flash memory has fifteen read voltages.

In addition, the flash memory may further include a penta-level cell (PLC) flash memory. Each memory cell may store 5 bits of data, and accordingly, 32 kinds of binary data may be stored.

In practical applications, since the structural sizes and doping concentrations of the plurality of memory cells of the flash memories (including the SLC flash memory, the MLC flash memory, the TLC flash memory, and the QLC flash memory describe above) cannot be exactly the same, the threshold voltages of the plurality of memory cells will not be exactly the same, and therefore, the (erasing or programming) threshold voltages of different data states are distributed within a certain range. Take the threshold voltages (Vt) as the abscissa, and the counts of memory cells (count) under different threshold voltages as the ordinate, so that there is a threshold voltage distribution map (Vt distribution), wherein for different types of flash memories, the larger the memory capacity of a single memory cell, the narrower the width of the threshold voltage distribution corresponding to a single data state.

Figure 3:
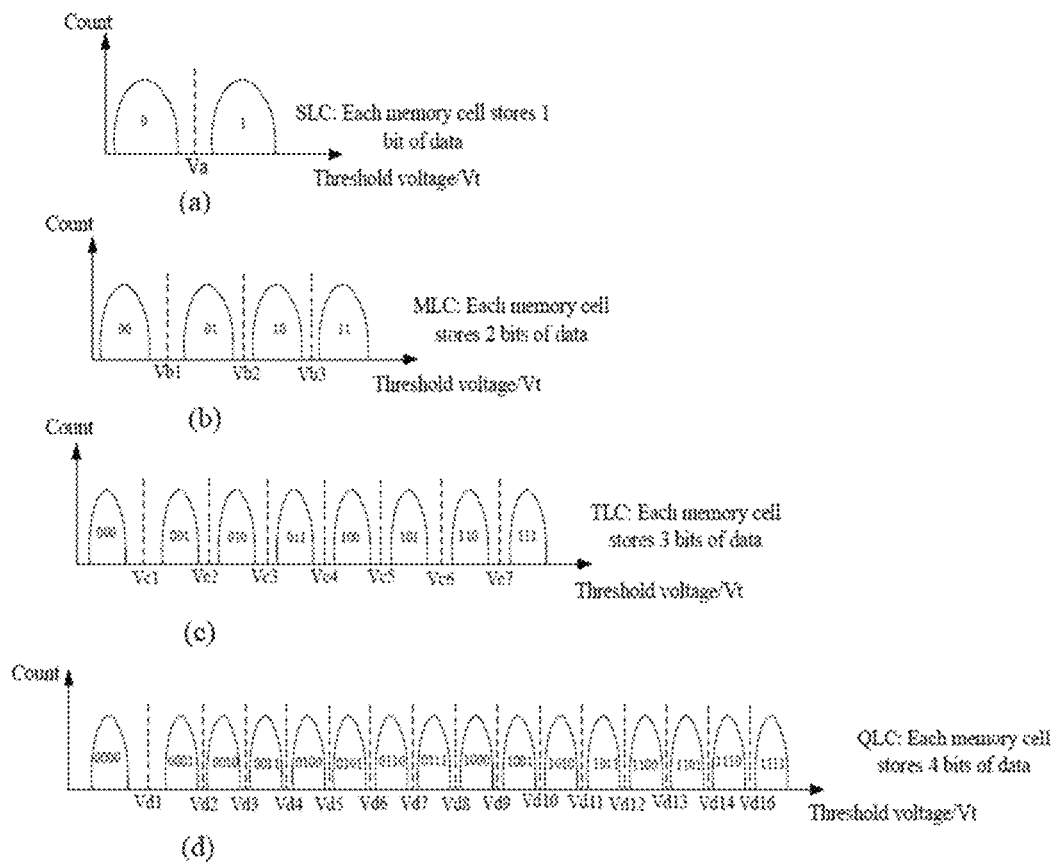
FIG. 3 is a schematic diagram of a threshold voltage distribution of a flash memory according to some implementations of the present disclosure.

Now refer to FIG. 3, which illustrates a threshold voltage distribution diagram of different types of flash memories. As shown in (a) of FIG. 3 and in combination with FIG. 2, for the SLC flash memory corresponding to two different data states 0 and 1, the threshold voltage distribution in an erased state is defined as 0, and the threshold voltage distribution in a programmed state as 1. An intermediate voltage Va between the threshold voltage distribution 0 and the threshold voltage distribution 1 is used as the read voltage of the SLC flash memory. The target data stored in the SLC flash memory may be read by using the read voltage Va. The read voltage Va may also be referred to as a default read voltage of the SLC flash memory.

For the MLC flash memory, as shown in (b) of FIG. 3 and in combination with FIG. 2, the four different data states corresponding to the MLC flash memory are respectively 00, 01, 10, and 11. Define the threshold voltage distribution in an erased state as 00, and the threshold voltage distributions in a programmed state as 01, 10, and 11, respectively. An intermediate voltage Vb1 between the threshold voltage distribution 00 and the threshold voltage distribution 01, an intermediate voltage Vb2 between the threshold voltage distribution 01 and the threshold voltage distribution 10, and an intermediate voltage Vb3 between the threshold voltage distribution 10 and the threshold voltage distribution 11 are used as three read voltages of the MLC flash memory. The target data stored in the SLC flash memory may be read by using the three read voltages Vb1, Vb2, and Vb3. The read voltages Vb1, Vb2, and Vb3 may also be referred to as default read voltages of the MLC flash memory.

For the TLC flash memory, as shown in (c) of FIG. 3 and in combination with FIG. 2, the eight different data states corresponding to the TLC flash memory are respectively 000, 001, 010, 011, 100, 101, 110, and 111. The threshold voltage distribution in an erased state is defined as 000, and the threshold voltage distribution in a programmed state as 001, 010, 011, 100, 101, 110, and 111, respectively. Intermediate voltages Vc1, Vc2, Vc3, Vc4, Vc5, and Vc6, that is, seven read voltages, sequentially between the threshold voltage distributions 000 to 111 are respectively used as read voltages of the TLC flash memory, to read target data stored in the SLC flash memory. The read voltages Vc1 to Vc6 may also be referred to as default read voltages of the TLC flash memory.

For the QLC flash memory, as shown in (d) of FIG. 3 and in combination with FIG. 2, sixteen different data states corresponding to the QLC flash memory respectively include 0000, 0001, 0010, 0011, 0100, 0101, 0110, 0111, 1000, 1001, 1010, 1011, 1100, 1101, 1110, and 1111. The threshold voltage distribution in the erased state is defined as 0000, and the other data states except the data state 0000 are the threshold voltage distributions of the programmed state. Intermediate voltages Vd1 to Vd15, that is, fifteen read voltages, sequentially between the threshold voltage distributions 0000 to 1111 are respectively used as read voltages of the TLC flash memory, to read target data stored in the QLC flash memory. The read voltages Vd1 to Vd15 may also be referred to as default read voltages of the QLC flash memory.

Figure 4:
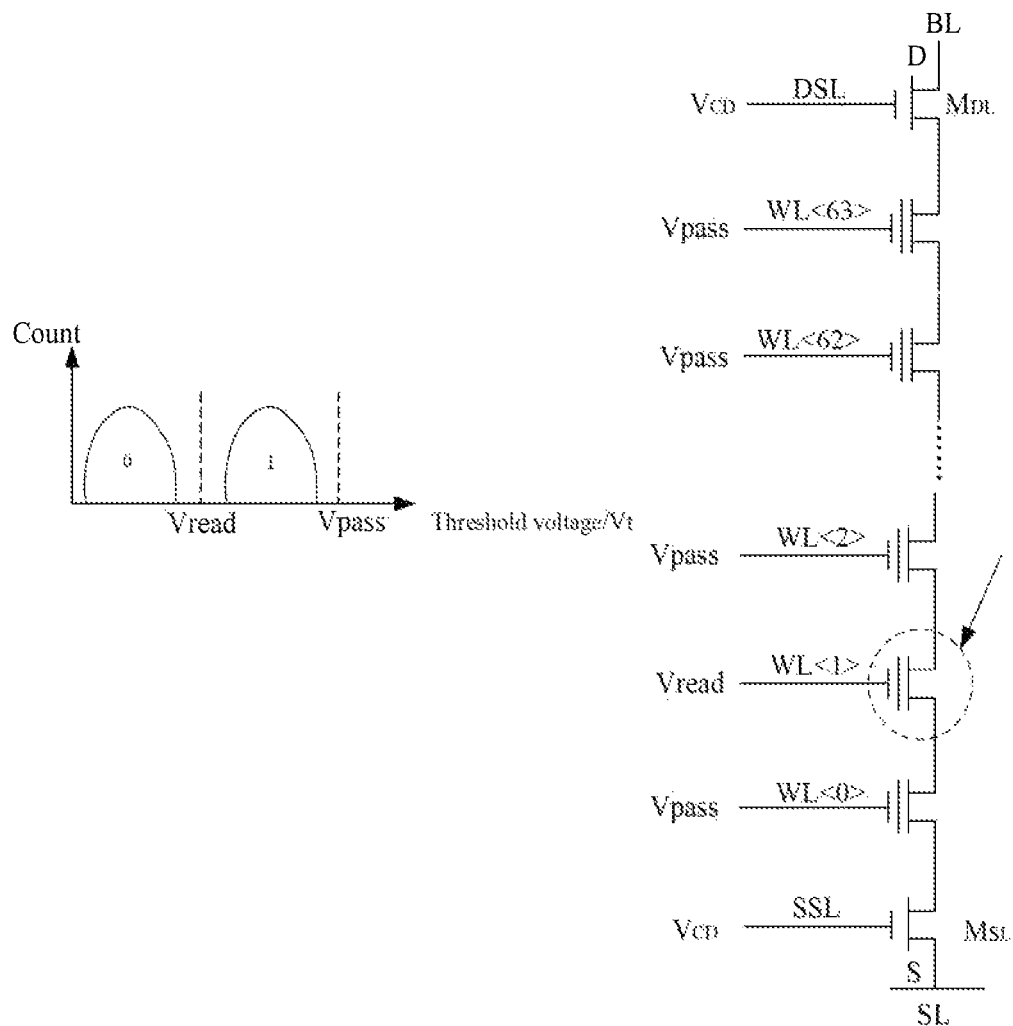
FIG. 4 is a schematic diagram of a read process of an SLC flash memory according to some implementations of the present disclosure.

Exemplarily, taking the SLC flash memory as an example, the read process of the flash memory is described. When a read operation is performed on the SLC flash memory, since the minimum read unit of the flash memory is a page, it is not easy to directly measure the threshold voltage of a selected memory cell. Since the output current of the memory cell is related to a gate voltage and the threshold voltage, the threshold voltage of the memory cell may be determined by measuring the current, to read the memory cell. Specifically, referring to FIG. 4, 64 memory cells constitute a string, the control gate of each memory cell is connected to a word line (WL). One WL represents one page, and a plurality of pages constitute one block. The drain (D) of a memory cell $M_{DL}$ at the tail of the string is connected to a bit line (BL). The source (S) of the memory cell $M_{DL}$ at the head of the string is connected to a source line (SL). Voltage $V_{CD}$ is applied to a source selection line SSL and a drain selection line DSL. Voltage Vpass (which is greater than a maximum threshold voltage of the programmed state) is applied to the control gate of an unselected memory cell, and voltage Vread (which is less than a minimum threshold voltage of the programmed state and is greater than a maximum threshold voltage of the erased state, for example, Vread may be equal to Va) is applied to the control gate of a selected memory cell. If a current value detected on the bit line is greater than or equal to threshold current (the threshold current is a critical current value for turning on the memory cell, for example, the threshold current may be equal to 0.3 mA), it means that the selected memory cell is turned on, and the selected memory cell is in the erased state 0; and if the current detected on the bit line is less than the threshold current, that is, the current detected on the bit line is micro-current and may be ignored, it means that the selected memory cell is not turned on, and the selected memory cell is in the programmed state 1, thereby completing the read operation on the selected memory cell.

It should be noted that, in addition to the SLC flash memory, the read processes of other types of flash memories, for example, the MLC flash memory, the TLC flash memory, and the QLC flash memory mentioned above are similar with the read process of the SLC flash memory, and thus details are not repeated here.

Since the threshold voltage of the memory cell of the flash memory is shifted during an actual application process or a preparation process, the number of error checking and error correcting code (ECC) when reading the target data in the flash memory will increase. For example, the read disturbance causes the threshold voltages of some memory cells of the flash memory to be shifted. Specifically, when performing a read operation, a voltage of 0V is applied to the conductive channel of the memory cell, the read voltage Vread is applied to the control gate of a read page, and the voltage Vpass is applied to the control gate of a non-read page. In this way, a relatively strong electric field would be formed between the gate and the channel of the non-read page. This electric field has a certain probability of causing electrons to enter the charge trapping layer, resulting in a weak programming effect, such that the threshold voltage of the memory cell of the non-read page is shifted. In some implementations, temperature-variable read (write the target data at a high temperature and read the target data at a low temperature, or write the target data at a low temperature and read the target data at a high temperature) may also cause the threshold voltage of the memory cell to be shifted. In some implementations, a high-temperature baking technique in the preparation process may cause the threshold voltage of the memory cell of the flash memory to be shifted.

Figure 5:
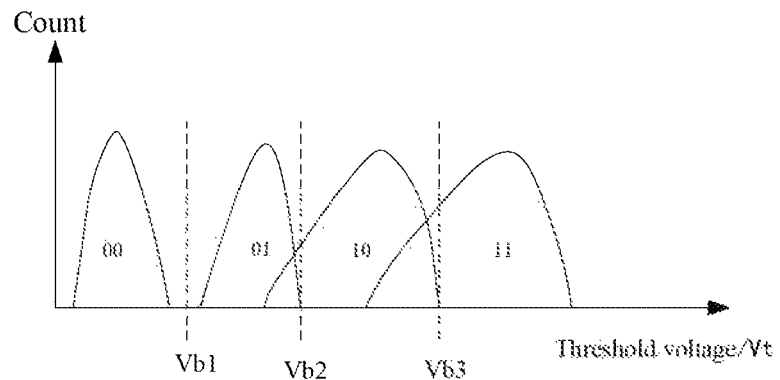
FIG. 5 is a schematic diagram of a threshold voltage distribution after the threshold voltage of an MLC flash memory is shifted according to some implementations of the present disclosure.

Exemplarily, taking the MLC flash as an example and in combination with (b) of FIG. 3, refer to FIG. 5 which illustrates a schematic diagram of a threshold voltage distribution after the threshold voltage of the memory cell of the MLC flash memory is shifted. As can be seen from FIG. 5, there is an intersecting portion between the threshold voltage distribution 01 in the programmed state and the threshold voltage distribution 10 in the programmed state, and there is an intersecting portion between the threshold voltage distribution 10 in the programmed state and the threshold voltage distribution 11 in the programmed state. At this time, if the target data stored in the MLC flash memory is read by using the default read voltages (e.g., the read voltages Vb1, Vb2 and Vb3 shown in (b) of FIG. 3) of the MLC flash memory, for example when the selected memory cell is read by using the default read voltage Vb3, the selected memory cell includes both the programmed state 01 and the programmed state 10, resulting in a read failure of the target data. Therefore, after the threshold voltage of the memory cell is deformed, the default read voltages of the MLC flash memory are no longer applicable.

When the target data is read according to the default read voltage and after the read failure of the target data, how to find an optimal read voltage becomes an urgent problem to be solved. At present, the optimal read voltage is found by the following three read schemes.

Figure 6:
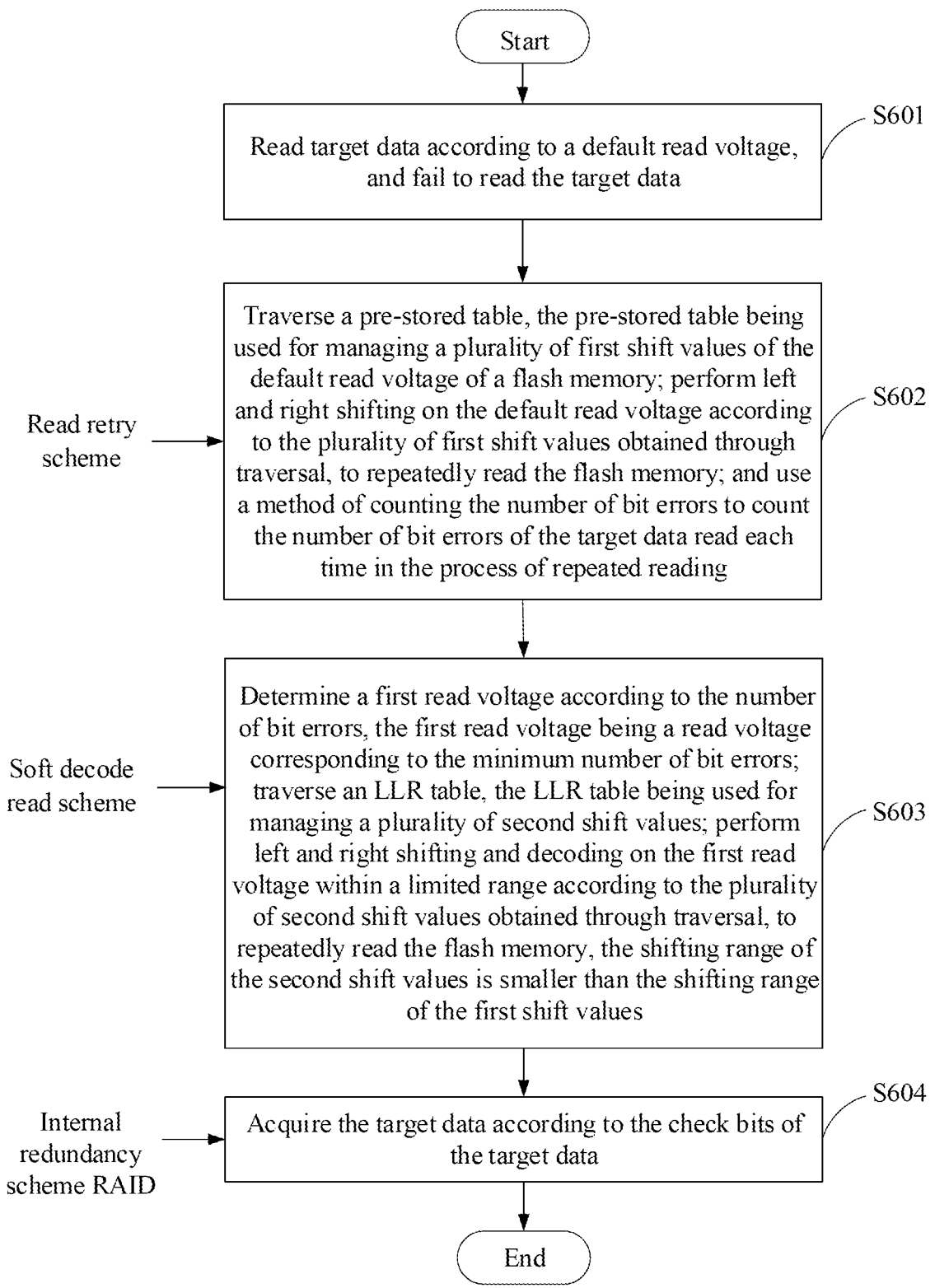
FIG. 6 is a schematic flow diagram of performing a plurality of read schemes according to some implementations of the present disclosure.

In a first implementation, the optimal read voltage is found by performing a read retry scheme. Exemplarily, FIG. 6 illustrates a schematic flow diagram of three read schemes. In step S601, target data is read according to a default read voltage. After the read failure of the target data, step S602 is performed. Step S602 includes: traversing a read retry table, the read retry table being pre-defined and being used for managing a plurality of first shift values of the default read voltage of the flash memory, and the read retry table may also be referred to as a pre-stored table; performing left and right shifting on the default read voltage according to the plurality of first shift values obtained by traversing the read retry table to repeatedly read the flash memory; and using a method of counting the number of bit errors to count the number of bit errors of the target data read each time in the process of repeated reading, so as to find an optimal read voltage at which the target data may be read.

In a second implementation, an optimal read voltage is found by performing a soft decode read scheme in a low-density parity check code (LDPC). Exemplarily, as shown in FIG. 6, after step S602, step S603 is performed. Step S603 includes: after determining the read failure of the target data according to step S602, determining a first read voltage according to the number of bit errors in the read retry scheme, the first read voltage being a read voltage corresponding to the minimum number of bit errors; traversing a log likelihood ratio (LLR) table, the LLR table being pre-defined and used for managing a plurality of second shift values; and according to the plurality of second shift values obtained through traversal, performing left and right shifting and decoding on the first read voltage within a limited range to repeatedly read the flash memory and search for an optimal read voltage at which the target data may be read, wherein a shifting range of the second shift values is smaller than a shifting range of the first shift values. However, both the read retry scheme and the soft decode read scheme may only find the optimal read voltage within a limited range, that is, the shifting ranges of the plurality of first shift values and the plurality of second shift values are fixed. In an extreme scenario, for example, when the threshold voltage of the memory cell is shifted so much that it exceeds a maximum shifting range of the shift values, the optimal read voltage cannot be found.

In a third implementation, the target data is obtained by performing an internal redundant arrays of independent disks (RAID). Exemplarily, as shown in FIG. 6, after step S603, step S604 is performed. Step S604 includes: after determining the read failure of the target data according to step S603, performing an exclusive OR (XOR) process on the target data, and writing the target data and the check bits of the target data together into the user data area. If one group of the target data is lost, the lost target data can be derived through other groups of target data and the check bits of the target data. However, when two or more groups of target data are lost, the lost target data cannot be recovered through the RAID.

Based on this, the implementations of the present disclosure provide an operation method of a memory system, a memory system, and an electronic device to determine an optimal read voltage of a flash memory (which may include the SLC flash memory, the MLC flash memory, the TLC flash memory, and the QLC flash memory provided above), so as to read target data. The structure of the electronic device provided in the implementations of the present disclosure will be first described below.

Figure 7:
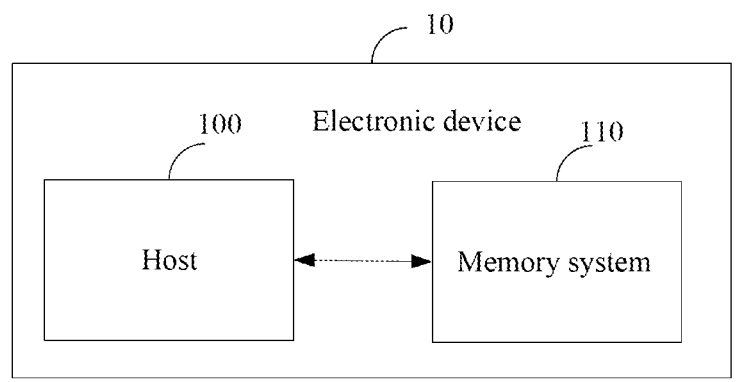
FIG. 7 is a block diagram of an electronic device according to some implementations of the present disclosure.

The implementations of the present disclosure provide an electronic device, for example, the electronic device may be any of a mobile phone, a desktop computer, a tablet computer, a notebook computer, a server, a vehicle-mounted device, a wearable device (such as a smartwatch, a smart wristband, smart glasses, and the like), a mobile power supply, a gaming machine, a digital multimedia player, etc. FIG. 7 illustrates a schematic diagram of an electronic device 10 provided in an implementation of the present disclosure. The electronic device 10 includes a host 100 and a memory system 110. The host 100 is coupled with the memory system 110, to write data into the memory system 110 or read data stored in the memory system 110, wherein the host 100 is also referred to as a master device, and the memory system 110 is also referred to as a slave device. In the electronic device, the slave device may be accessed by different master devices. For example, taking an example that the electronic device is a mobile phone, a central processing unit (CPU), a digital signal processor (DSP) and the like of the mobile phone may all serve as the host 100 to access the memory system 110.

Figure 8:
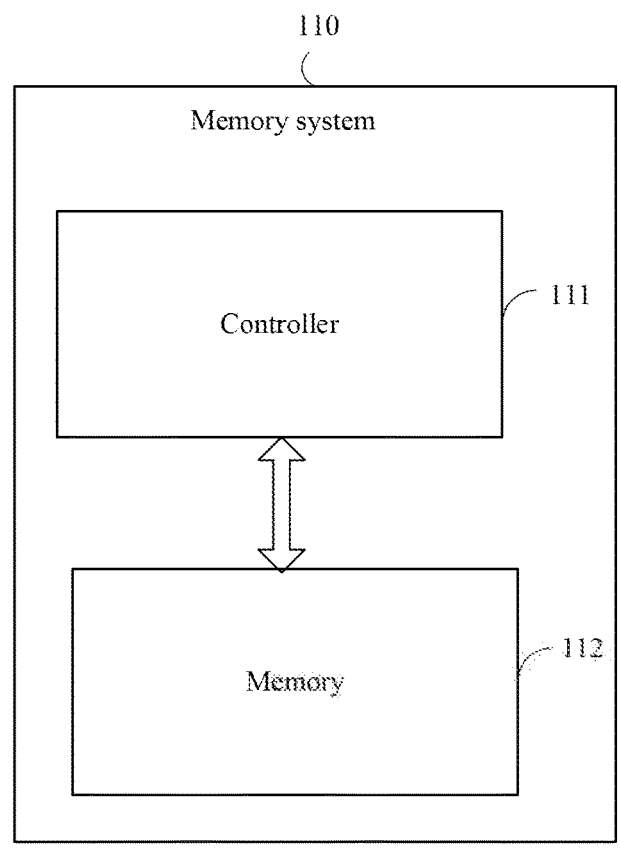
FIG. 8 is a block diagram of a memory system according to some implementations of the present disclosure.

Exemplarily, FIG. 8 illustrates a schematic diagram of a memory system 110 provided in an implementation of the present disclosure. The memory system 110 includes a controller 111 and a memory 112. The controller 111 is coupled to the memory 112 to control the memory 112 to store data.

The memory 112 may be a two-dimension (2D) memory or a three-dimension (3D) memory. The memory 112 may be the NAND flash memory provided above. For example, the memory 112 may be an SLC flash memory, an MLC flash memory, a TLC flash memory, a QLC flash memory or the like in the NAND flash memory.

The memory system 110 may be integrated into various types of memory devices, for example, being included in the same package (e.g., a universal flash storage (UFS) package or an embedded multi-media card (eMMC) package. That is, the memory system 1000 may be applied to and packaged into different types of electronic products, for example, mobile phones (e.g., a cell phone), desktop computers, tablet computers, notebook computers, servers, vehicle-mounted devices, game consoles, printers, positioning devices, wearable devices, smart sensors, mobile power supplies, virtual reality (VR) devices, augmented reality (AR) devices, or any other suitable electronic devices having memories therein.

In some implementations, the memory system 110 includes a controller 111 and a memory 112. The memory system 110 may be integrated into a memory card. The memory card includes any one of a personal computer memory card international association (PCMCIA) card (abbreviated as a PC card), a compact flash (CF) card, a smart media (SM) card, a memory stick, a multimedia card (MMC), a secure digital memory card (SD) card, or a UFS.

Figure 9:
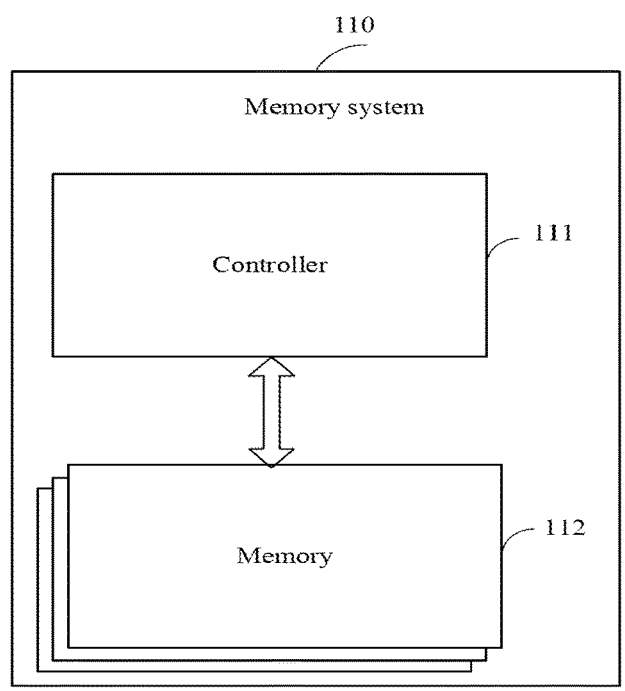
FIG. 9 is a block diagram of another memory system according to some implementations of the present disclosure.

In some other implementations, referring to FIG. 9, the memory system 110 includes a controller 111 and a plurality of memories 112, and the memory system 110 is integrated into a solid state drive (SSD).

In the memory system 110, in some implementations, the controller 111 is configured to operate in a low duty cycle environment, such as an SD card, a CF card, a universal serial bus (USB for short) flash memory driver, or other media for use in electronic devices such as personal calculators, digital cameras, and mobile phones.

In some other implementations, the controller 111 is configured to operate in a high duty cycle environment SSD or eMMC, and the SSD or eMMC serves as a data memory of mobile devices such as smartphones, tablet computers, and laptop computers and an enterprise memory array.

In some implementations, the controller 111 may be configured to manage data stored in the memory 112 and communicate with an external device (e.g., a host 100). In some implementations, the controller 111 may also be configured to control the operations of the memory 112, such as reading, erasing and programming operations. In some implementations, the controller 111 may also be configured to manage various functions regarding the data stored in or to be stored in the memory 112, including at least one of bad block management, garbage collection (GC), logical address to physical address transformation and loss equalization. In some implementations, the controller 111 is further configured to process an error correcting code regarding data that is read from the memory 112 or written into the memory 112.

Of course, the controller 111 may also perform any other suitable functions, for example, flushing a cache space of the memory 112 or formatting the memory 112 and the like, as provided in the implementations of the present disclosure.

In addition, the controller 111 may communicate with an external device (e.g., the host 100) via at least one of various interface protocols.

It should be noted that, the interface protocols include at least one of a universal serial bus (USB) protocol, a Microsoft management console (MMC) protocol, a peripheral component interconnect (PCI) protocol, a peripheral component interconnect express (PCI-E) protocol, an advanced technology attachment (ATA) protocol, a serial ATA protocol, a parallel ATA protocol, a small computer system interface (SCSI) protocol, an enhanced small disk interface (ESDI) protocol, an integrated drive electronic (IDE) protocol, and a firewire protocol.

Figure 10:
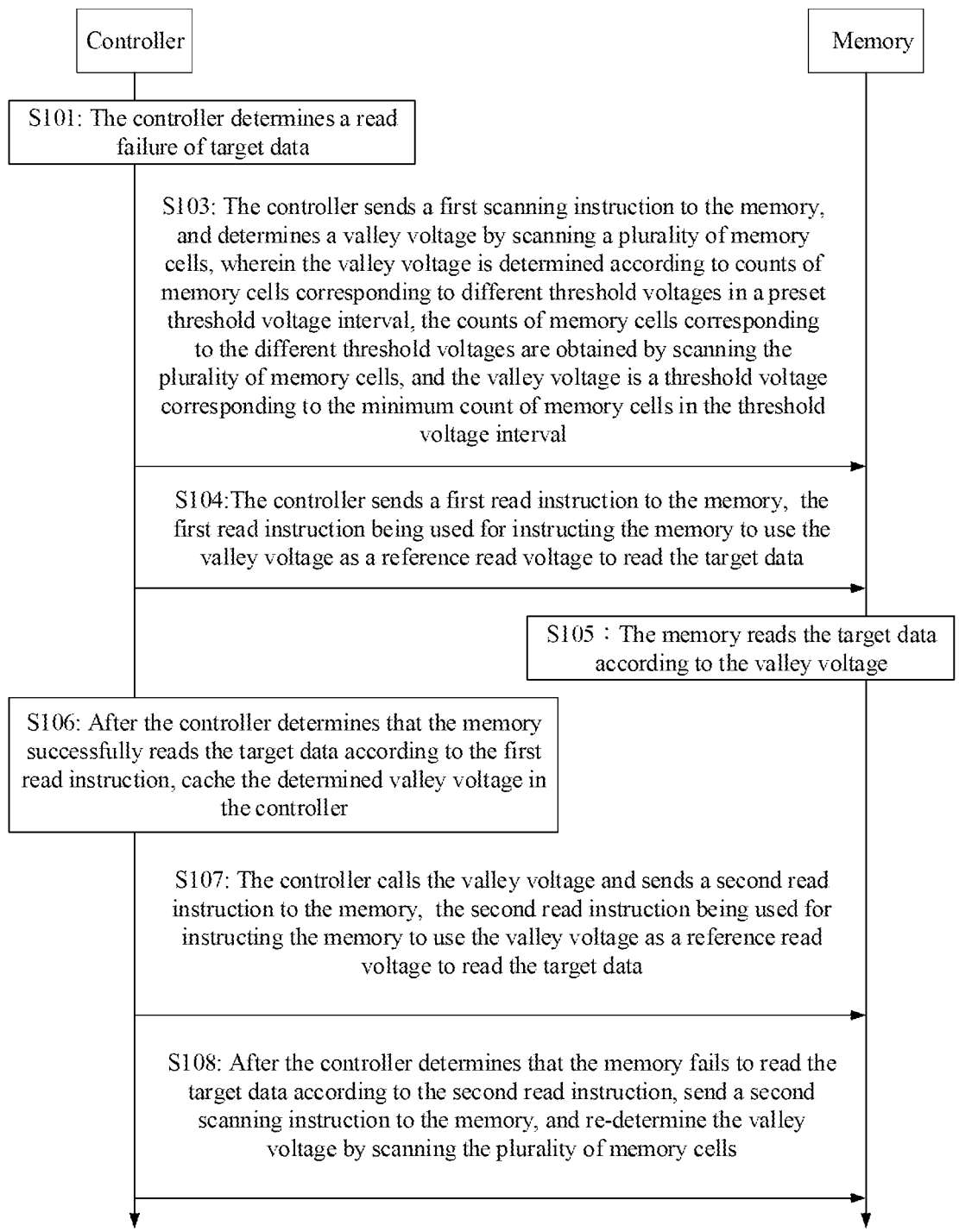
FIG. 10 is a schematic flow diagram of an operation method of a memory system according to some implementations of the present disclosure.

Based on the memory system shown in FIG. 8 and FIG. 9, an operation method of a memory system provided in the implementations of the present disclosure are described below. Referring to FIG. 10, the operation method of the memory system provided in the implementations of the present disclosure may include the following steps:

S101: a controller determines a read failure of target data.

Specifically, before the controller sends a first scanning command to a memory, the controller instructs the memory to read the target data according to a default read voltage, and receives read information output by the memory. The controller determines, according to the read information output by the memory, that the memory fails to read the target data according to the default read voltage.

S103: the controller sends the first scanning command to the memory, and determines a valley voltage by scanning a plurality of memory cells, wherein the valley voltage is determined according to counts of memory cells corresponding to different threshold voltages in a preset threshold voltage interval. The counts of memory cells corresponding to the different threshold voltages are obtained by scanning the plurality of memory cells, and the valley voltage is a threshold voltage corresponding to the minimum count of memory cells in the threshold voltage interval.

The first scanning command may include an initial scanning voltage VS, a scanning precision Vd and a cut-off voltage VE. The specific data of the initial scanning voltage VS, the scanning precision Vd, and the cut-off voltage VE are related to the type of the flash memory, for example, the initial scanning voltage VS of the TLC flash memory may be −5V, 4V, −3V, −2.5V or the like, the scanning precision Vd may be 0.05V, 0.01V, 0.1V or the like, and the cut-off voltage VE may be 5V, 6V, 8V or the like. This is not specifically limited in the implementations of the present disclosure.

In addition, a number of valley voltages of the flash memory is the same as a number of default read voltages, for example, the SLC flash memory has one default read voltage and has one valley voltage correspondingly; the MLC flash memory has three default read voltages and has three valley voltages correspondingly; the TLC flash memory has seven default read voltages and has seven valley voltages correspondingly; and the QLC flash memory has fifteen default read voltages and has fifteen valley voltages correspondingly.

Secondly, the preset threshold voltage interval is determined according to the default read voltage of the flash memory and a preset interval. For example, the default read voltage of the flash memory is shifted left and right according to the preset interval to obtain the preset threshold voltage interval. The default read voltage is a corresponding read voltage when the threshold voltage of the flash memory is not shifted, for example, the default voltages of different types of flash memories shown in FIG. 3. The preset interval is pre-set, and the preset interval may be predefined according to the size of the default read voltage, for example, the preset interval may be (−0.3, 0.3), (−0.5, 0.5), (−1.28, 1.28), or the like. When the flash memory includes a plurality of default read voltages, a maximum value in the preset interval is less than an absolute value of a difference between any two adjacent read voltages. The preset intervals corresponding to different types of flash memories may be the same or different, and this is not specifically limited in the implementations of the present disclosure.

Moreover, the threshold voltages described in step S103 are actual threshold voltages of the plurality of memory cells obtained by the memory by scanning the plurality of memory cells according to the first scanning command.

Furthermore, determining the valley voltage by scanning the plurality of memory cells may include: determining, by the memory, different scanning voltages according to the first scanning command; outputting, by the memory, scanning information to the controller according to the first scanning command, the scanning information including scanning data of the plurality of memory cells under the different scanning voltages; and determining, by the controller, the valley voltage according to the scanning data of the plurality of memory cells under the different scanning voltages. The scanning data may also be referred to as an output value, the output value being 0 or 1.

Specifically, the memory receives the first scanning command, uses the initial scanning voltage VS as a first scanning voltage to scan the plurality of memory cells, and records the output value (0 or 1) of each of the plurality of memory cells under the initial scanning voltage VS to complete a first scanning, wherein 0 indicates that the initial scanning voltage Vs is less than the threshold voltage of the memory cell, and 1 indicates that the initial scanning voltage VS is greater than or equal to the threshold voltage of the memory cell. The memory adds the scanning precision VD (serving as a step voltage) on the basis of the first scanning voltage, so as to determine a second scanning voltage, scans the plurality of memory cells according to the second scanning voltage, records the output value (0 or 1) of each of the memory cells under the second scanning voltage, so as to complete a second scanning, and so on. The memory determines different scanning voltages by sequentially adding the scanning precision step by step, and records the output value of each of the plurality of memory cells under the different scanning voltages until the scanning voltage is equal to the cut-off voltage, and stops scanning, so as to obtain the scanning data of the plurality of memory cells under the different scanning voltages.

Furthermore, the determining, by the controller, the valley voltage according to the scanning data of the plurality of memory cells under the different scanning voltages may include: determining, by the controller, the threshold voltages of the plurality of memory cells and the counts of memory cells corresponding to the different threshold voltages, according to the scanning data of the plurality of memory cells under the different scanning voltages; and determining, by the controller, the threshold voltage corresponding to the minimum count of memory cells in the preset threshold voltage interval as the valley voltage, according to the counts of memory cells corresponding to the different threshold voltages.

Specifically, the controller receives the scanning data of the plurality of memory cells under the different scanning voltages output by the memory. For each memory cell under each scanning voltage, an output value 0 indicates that the scanning voltage is less than the threshold voltage of the memory cell, and an output value 1 indicates that the scanning voltage is greater than or equal to the threshold voltage of the memory cell. Based on such a principle, the controller processes the received scanning data to obtain different threshold voltages, as well as the counts of memory cells corresponding to the different threshold voltages, and correspondingly obtains a mapping table of the threshold voltages and the counts of memory cells.

Exemplarily, taking the TLC flash memory as an example, the specific process of determining the valley voltage of the TLC flash memory is described in detail below. For the TLC flash memory, the initial scanning voltage VS is equal to −3V, the scanning precision VD is equal to 0.1V, and the cut-off voltage VE is equal to 5V, including 147456 memory cells, for example. The mapping table of the threshold voltages (Vt) and the counts of memory cells of the TLC flash memory, which are obtained by scanning the TLC flash memory, is shown in Table 1.

TABLE 1

| Vt | count |
| --- | --- |
| −2.5 | 10913 |
| −2.4 | 38 |
| −2.3 | 120 |
| −2.2 | 132 |
| −2.1 | 99 |
| −2.0 | 88 |
| −1.9 | 96 |
| −1.8 | 109 |
| −1.7 | 141 |
| −1.6 | 476 |
| −1.5 | 1547 |
| −1.4 | 3966 |
| −1.3 | 2893 |
| −1.2 | 1903 |
| −1.1 | 903 |
| −1.0 | 493 |
| −0.9 | 427 |
| −0.8 | 813 |
| −0.7 | 2051 |
| −0.6 | 4691 |
| −0.5 | 2928 |
| −0.4 | 1540 |
| −0.3 | 884 |
| −0.2 | 690 |
| −0.1 | 689 |
| 0.0 | 1362 |
| 0.1 | 2716 |
| 0.2 | 6562 |
| 0.3 | 2310 |
| 0.4 | 1244 |
| 0.5 | 1050 |
| 0.6 | 894 |
| 0.7 | 1106 |
| 0.8 | 1921 |
| 0.9 | 3487 |
| 1.0 | 6128 |
| 1.1 | 2656 |
| 1.2 | 1800 |
| 1.3 | 1532 |
| 1.4 | 1419 |
| 1.5 | 1611 |
| 1.6 | 2875 |
| 1.7 | 4174 |
| 1.8 | 5930 |
| 1.9 | 2953 |
| 2.0 | 2077 |
| 2.1 | 1823 |
| 2.2 | 1492 |
| 2.3 | 1582 |
| 2.4 | 1965 |
| 2.5 | 3615 |
| 2.6 | 4911 |
| 2.7 | 2377 |
| 2.8 | 3985 |
| 2.9 | 3488 |
| 3.0 | 2686 |
| 3.1 | 2221 |
| 3.2 | 1723 |
| 3.3 | 1602 |
| 3.4 | 2052 |
| 3.5 | 2690 |
| 3.6 | 3254 |
| 3.7 | 3572 |
| 3.8 | 2784 |
| 3.9 | 2315 |
| 4.0 | 1454 |
| 4.1 | 814 |
| 4.2 | 403 |
| 4.3 | 151 |
| 4.4 | 41 |
| 4.5 | 15 |
| 4.6 | 3 |
| 4.7 | 0 |
| 4.8 | 1 |

TABLE 1-continued

| Vt | count |
|---|---|
| 4.9 | 0 |
| 5.0 | 0 |
| / | / |
| / | / |
| / | / |
| / | / |

Specifically, in combination with Table 1 and (c) of FIG. 3, the TLC flash memory has seven default read voltages and has seven valley voltages correspondingly. It is assumed that the first default read voltage Vc1 of the TLC flash memory is equal to −2.5 V, the second default read voltage is equal to −1V, the third default read voltage is equal to 0V, the fourth default read voltage is equal to 0.5V, the fifth default read voltage is equal to 1.5V, the sixth default read voltage is equal to 2.1V, the seventh default read voltage is equal to 3.2V, and the predefined preset interval is (−0.3, 0.3). According to the preset interval (−0.3, 0.3) and the first default read voltage −2.5V, the threshold voltage interval corresponding to the first default read voltage −2.5V is determined to be (−2.8, −2.2), and the threshold voltage corresponding to the minimum count of memory cells in the threshold voltage interval (−2.8, −2.2) is taken as a first valley voltage. As can be seen from Table 1, the minimum count of memory cells in the threshold voltage interval (−2.8, −2.2) is 38, and the corresponding threshold voltage is −2.4V, and thereby the first valley voltage is determined to be −2.4V. According to the preset interval (−0.3, 0.3) and the second default read voltage −1V, the threshold voltage interval corresponding to the second default read voltage −1V is determined to be (−1.3, −0.7), and the threshold voltage corresponding to the minimum count of memory cells in the threshold voltage interval (−1.3, −0.7) is taken as a second valley voltage. The minimum count of memory cells in the threshold voltage interval (−1.3, −0.7) is 427, and the corresponding threshold voltage is −0.9V, and thereby the second valley voltage is determined to be −0.9V. In this way, it is respectively determined that the third valley voltage is −0.1V, the fourth valley voltage is 0.6V, the fifth valley voltage is 1.4V, the sixth valley voltage is 2.2V, and the seventh valley voltage is 3.3V, and thereby the valley voltages of the TLC flash memory are obtained.

Figure 11:
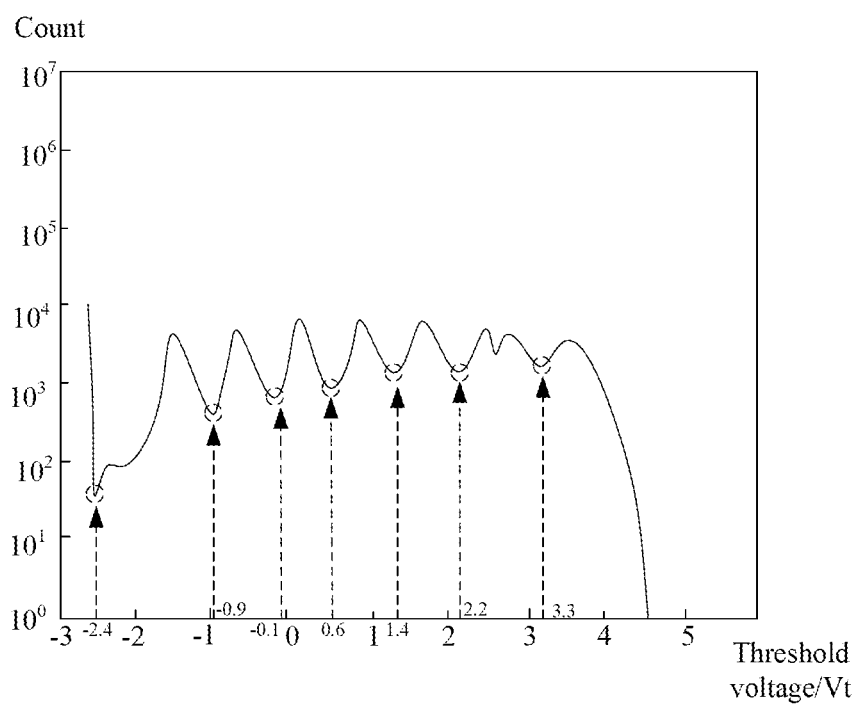
FIG. 11 is a schematic diagram of a threshold voltage distribution of a TLC flash memory according to some implementations of the present disclosure.

Exemplarily, FIG. 11 is a distribution diagram of threshold voltages obtained according to the threshold voltages (Vt) and the counts of memory cells as shown in Table 1. As shown in FIG. 11, the valley voltages of the TLC flash memory are as follows: a first valley voltage of −2.4V, a second valley voltage of −0.9V, a third valley voltage of −0.1V, a fourth valley voltage of 0.6V, a fifth valley voltage of 1.4V, a sixth valley voltage of 2.2V, and a seventh valley voltage of 3.3V.

It should be noted that, the process of determination of the valley voltages of other flash memories except the TLC flash memory is similar with the process of determination of the valley voltages of the TLC flash memory, and thus details are not repeated here.

Exemplarily, in combination with FIG. 10, the operation method of the memory system provided by the implementations of the present disclosure further includes:

S104: the controller sends a first read command to the memory, the first read command being used for instructing the memory to use the valley voltage as a reference read voltage to read target data.

Exemplarily, in combination with FIG. 10, the operation method of the memory system provided by the implementations of the present disclosure further includes:

S105: the memory reads the target data according to the valley voltage.

In an implementation, after step S105, the controller receives the target data read by the memory according to the first read command, and determines that the target data is read successfully. The controller caches the valley voltage for the next read of the target data. Exemplarily, in combination with FIG. 10, after step S105, the operation method of the memory system provided by the implementations of the present disclosure further includes:

S106: after determining that the memory successfully reads the target data according to the first read command, the controller caches the determined valley voltage in the controller.

In one implementation, after step S106, the controller has the cached valley voltage. If the controller wants to read the target data again, the controller does not need to send a scanning command to the memory again, but may directly call the valley voltage and send a second read command to the memory, so as to instruct the memory to use the valley voltage as the reference read voltage to read the target data, thereby improving the efficiency of reading the target data. Exemplarily, in combination with FIG. 10, after step S106, the operation method of the memory system provided by the implementations of the present disclosure further includes:

S107: the controller calls the valley voltage and sends the second read command to the memory, the second read command being used for instructing the memory to use the valley voltage as the reference read voltage to read the target data.

In one implementation, after step S107, the controller receives the target data read by the memory according to the second read command and determines a read failure of the target data, which indicates that the threshold voltage of the memory cell of the memory is shifted again, and that the memory cannot successfully read the target data according to the valley voltage obtained by scanning according to the first scanning command. Therefore, the controller needs to re-scan the memory cell of the memory, so as to determine a new valley voltage. Exemplarily, in combination with FIG. 10, after step S107, the operation method of the memory system provided by the implementations of the present disclosure further includes:

S108: after determining that the memory fails to read the target data according to the second read command, the controller sends a second scanning command to the memory to re-determine the valley voltage by scanning the plurality of memory cells.

Figure 12:
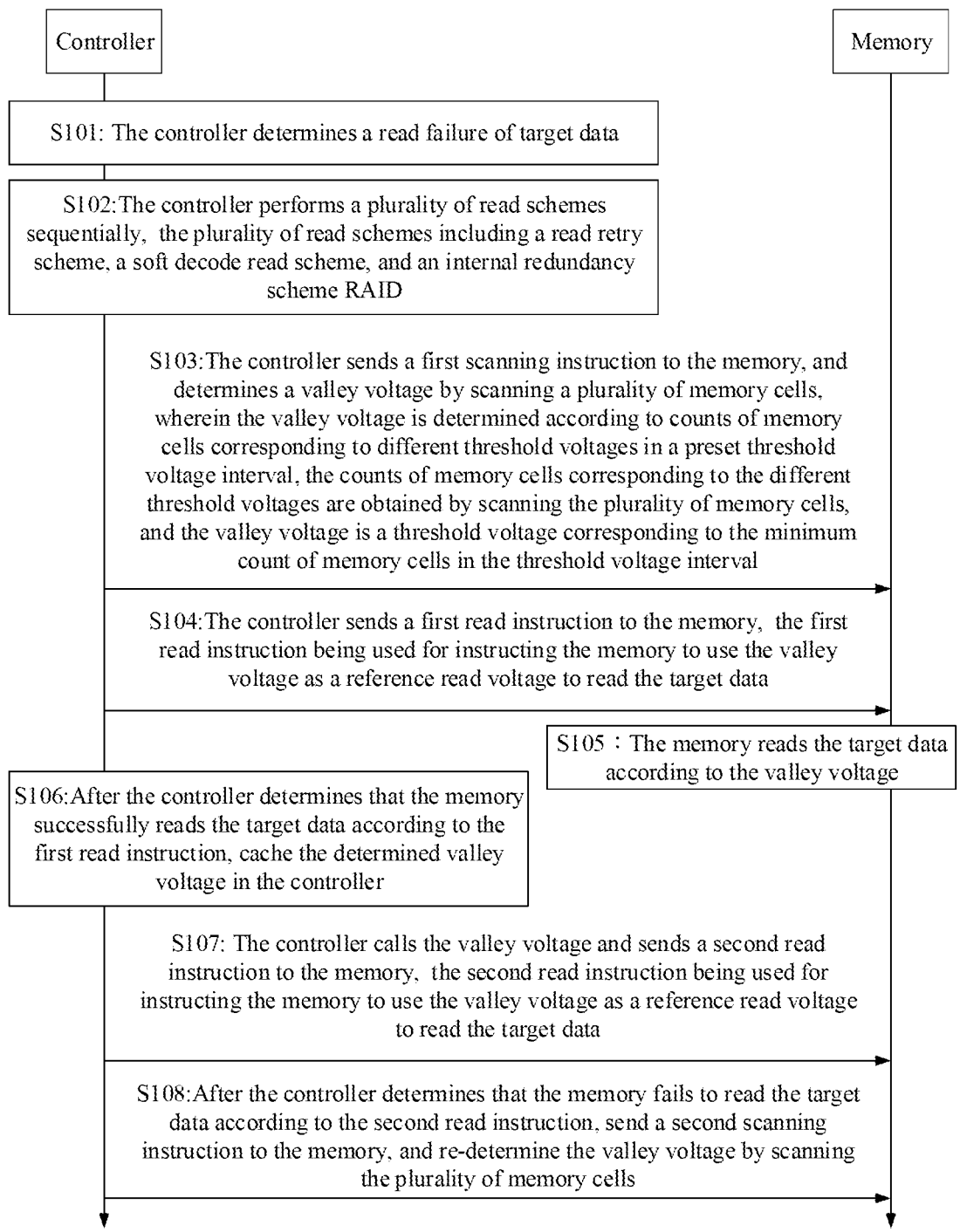
FIG. 12 is a schematic flow diagram of another operation method of a memory system according to some implementations of the present disclosure.

In another implementation, referring to FIG. 12, after step S101 and before step S103, the operation method of the memory system provided by the implementations of the present disclosure further includes:

S102: the controller sequentially performs a plurality of read schemes, the plurality of read schemes including a read retry scheme, a soft decode read scheme, and an internal redundancy scheme RAID.

Specifically, the controller performs the read miry scheme and determines the read failure of the target data; the controller performs the soft decode read scheme and determines the read failure of the target data; and the controller performs the internal redundancy scheme RAID and determines the read failure of the target data. The detailed process of the controller performing the read retry scheme, the soft decode read scheme, and the internal redundancy scheme RAID may refer to the above description, and thus details are not repeated here.

The implementations of the present disclosure further provide a memory system; for example, the memory system may be the memory system 110 shown in FIG. 8 and FIG. 9 in the foregoing examples. The memory system 110 includes a memory 112, and a controller 111 provided in the above examples. The controller 111 is coupled to the memory 112, so as to control the memory 112 to store data.

In one implementation of the present disclosure, the controller is configured to: send a first scanning command to the memory and determine a valley voltage by scanning the plurality of memory cells, wherein the valley voltage is determined according to counts of memory cells corresponding to different threshold voltages in a preset threshold voltage interval, the counts of memory cells corresponding to the different threshold voltages being obtained by scanning the plurality of memory cells, the valley voltage being a threshold voltage corresponding to the minimum count of memory cells in the threshold voltage interval. The controller is further configured to send a first read command to the memory, the first read command being used for instructing the memory to use the valley voltage as a reference read voltage to read target data. The memory is configured to read the target data according to the valley voltage.

In one implementation of the present disclosure, the controller is further configured to: determine a read failure of the target data before sending the first scanning command to the memory; and perform a plurality of read schemes sequentially, the plurality of read schemes including a read retry scheme, a soft decode read scheme, and an internal redundancy scheme RAID.

In one implementation of the present disclosure, the controller is further configured to: after determining that the memory successfully reads the target data according to the first read command, cache the determined valley voltage.

In one implementation of the present disclosure, the controller is further configured to: after the caching the determined valley voltage, call the valley voltage and send a second read command to the memory, the second read command being used for instructing the memory to use the valley voltage as a reference read voltage to read the target data.

In one implementation of the present disclosure, the controller is further configured to: after determining that the memory fails to read the target data according to the second read command, send a second scanning command to the memory and re-determine a valley voltage by scanning the plurality of memory cells.

In one implementation of the present disclosure, the memory is further configured to determine different scanning voltages according to the first scanning command, the different scanning voltages including threshold voltages of the plurality of memory cells. The memory is further configured to output scanning information to the controller according to the first scanning command, the scanning information including scanning data of the plurality of memory cells corresponding to the different threshold voltages. The controller is further configured to determine the valley voltage according to the scanning data of the plurality of memory cells corresponding to the different threshold voltages.

In one implementation of the present disclosure, the controller is specifically configured to: determine the counts of memory cells corresponding to the different threshold voltages according to the scanning data of the plurality of memory cells corresponding to the different threshold voltages; and determine a threshold voltage corresponding to the minimum count of memory cells in the preset threshold voltage interval as the valley voltage, according to the counts of memory cells corresponding to the different threshold voltages.

In another implementation of the present disclosure, the controller is configured to determine a read failure of target data. The controller is further configured to perform a plurality of read schemes sequentially, the plurality of read schemes including a read retry scheme, a soft decode read scheme, and an internal redundancy scheme RAID. The controller is further configured to: after performing the internal redundancy scheme RAID, send a first scanning command to the memory and determine a valley voltage by scanning the plurality of memory cells. The valley voltage is determined according to counts of memory cells corresponding to different threshold voltages in a preset threshold voltage interval, the counts of memory cells corresponding to the different threshold voltages being obtained by scanning the plurality of memory cells, the valley voltage being a threshold voltage corresponding to the minimum count of memory cells in the threshold voltage interval. The controller is further configured to send a first read command to the memory, the first read command being used for instructing the memory to use the valley voltage as a reference read voltage to read the target data. The memory is configured to read the target data according to the valley voltage.

In one implementation of the present disclosure, the controller is configured to: send a first scanning command to the memory, and determine a valley voltage by scanning the plurality of memory cells. The valley voltage is determined according to the counts of memory cells corresponding to different threshold voltages in a preset threshold voltage interval, the counts of memory cells corresponding to the different threshold voltages are obtained by scanning the plurality of memory cells, and the valley voltage is a threshold voltage corresponding to the minimum count of memory cells in the threshold voltage interval. The controller is further configured to send a first read command to the memory, the first read command being used for instructing the memory to use the valley voltage as a reference read voltage to read target data. The controller is further configured to receive the target data output by the memory.

In one implementation of the present disclosure, the controller is further configured to: after determining that the memory successfully reads the target data according to the first read command, cache the determined valley voltage.

In one implementation of the present disclosure, the controller is further configured to: after caching the determined valley voltage, call the valley voltage and send a second read command to the memory, the second read command being used for instructing the memory to use the valley voltage as a reference read voltage to read the target data.

In one implementation of the present disclosure, the controller is further configured to: after determining that the memory fails to read the target data according to the second read command, send a second scanning command to the memory and re-determine a valley voltage by scanning the plurality of memory cells.

In one implementation of the present disclosure, the controller is configured to: receive scanning information output by the memory according to the first scanning command, the scanning information including scanning data of the plurality of memory cells corresponding to the different threshold voltages, wherein different scanning voltages are determined by the memory according to the first scanning command, the different scanning voltages including the threshold voltages of the plurality of memory cells. The controller is further configured to determine the valley voltage according to the scanning data of the plurality of memory cells corresponding to the different threshold voltages.

In one implementation of the present disclosure, the controller is configured to: determine the counts of memory cells corresponding to the different threshold voltages according to the scanning data of the plurality of memory cells corresponding to the different threshold voltages; and determine a threshold voltage corresponding to the minimum count of memory cells in the preset threshold voltage interval as the valley voltage, according to the counts of memory cells corresponding to the different threshold voltages.

In another implementation of the present disclosure, the controller is configured to: determine a read failure of target data; perform a plurality of read schemes sequentially, the plurality of read schemes including a read retry scheme, a soft decode read scheme, and an internal redundancy scheme RAID; after performing the internal redundancy scheme RAID, send a first scanning command to the memory, and determine a valley voltage by scanning the plurality of memory cells, wherein the valley voltage is determined according to the counts of memory cells corresponding to different threshold voltages in a preset threshold voltage interval, the counts of memory cells corresponding to the different threshold voltages are obtained by scanning the plurality of memory cells, and the valley voltage is a threshold voltage corresponding to the minimum count of memory cells in the threshold voltage interval; send a first read command to the memory, the first read command being used for instructing the memory to use the valley voltage as a reference read voltage to read the target data; and receive the target data output by the memory.

The implementations of the present disclosure further provide an electronic device, for example, which may be the electronic device 10 shown in FIG. 7 in the foregoing examples, including a host 100 and the memory system 110 provided in the foregoing several implementations. The host 100 is connected to the memory system 110, so as to write data into the memory system 110 or read data stored in the memory system.

The implementations of the present disclosure further provide a computer-readable memory medium including computer instructions, and when running on the memory system 110 provided in the foregoing several implementations, the computer instructions cause the memory system 110 to perform the operation method of the memory system provided in the implementations of the disclosure.

The implementations of the present disclosure further provide a computer program product including instructions, when running on the memory system 110 provided in the foregoing several implementations, the computer program product cause the memory system 110 to perform the operation method of the memory system provided in the implementations of the disclosure.

The foregoing descriptions are merely specific implementations of the disclosure, but the protection scope of the disclosure is not limited thereto, and modifications or substitutions, which may be conceived by any person skilled in the art who is familiar with this art within the technical scope disclosed in the present disclosure, should be covered within the protection scope of the present disclosure. Therefore, the protection scope of the present disclosure shall be subject to the protection scope of the claims.

What is claimed is:

1. An operation method of a memory system, the memory system comprises a controller and a memory coupled with each other, the memory including a plurality of memory cells, the method comprising:
upon a determination that a read failure of target data has happened, performing, by the controller, at least one read scheme selected from a plurality of read schemes, the plurality of read schemes including a read retry scheme, a soft decode read scheme, and an internal redundancy scheme RAID;
sending, by the controller, a first scanning command to the memory and determining a valley voltage by scanning the plurality of memory cells, wherein the valley voltage is determined according to counts of memory cells corresponding to different threshold voltages in a preset threshold voltage interval, the counts of memory cells corresponding to the different threshold voltages being obtained by scanning the plurality of memory cells, the valley voltage being a threshold voltage corresponding to the minimum count of memory cells in the threshold voltage interval;
sending, by the controller, a first read command to the memory, the first read command being used for instructing the memory to use the valley voltage as a reference read voltage to read the target data;
reading, by the memory, the target data according to the valley voltage; and
after determining, by the controller, that the memory successfully reads the target data according to the first read command, caching the determined valley voltage in the controller.

2. The method of claim 1, wherein the step of performing the at least one read scheme further comprises performing sequentially the read retry scheme, the soft decode read scheme, and the internal redundancy scheme RAID.

3. The method of claim 1, wherein after the caching the determined valley voltage in the controller, the method further comprises:
calling, by the controller, the valley voltage, and sending a second read command to the memory, the second read command being used for instructing the memory to use the valley voltage as a reference read voltage to read the target data.

4. The method of claim 3, wherein after determining, by the controller, that the memory fails to read the target data according to the second read command, the method further comprises:
sending, by the controller, a second scanning command to the memory and re-determining a valley voltage by scanning the plurality of memory cells.

5. The method of claim 1, wherein the determining the valley voltage by scanning the plurality of memory cells comprises:
determining, by the memory, different scanning voltages according to the first scanning command, the different scanning voltages including threshold voltages of the plurality of memory cells;
outputting, by the memory, scanning information to the controller according to the first scanning command, the scanning information including scanning data of the plurality of memory cells corresponding to the different threshold voltages; and determining, by the controller, the valley voltage according to the scanning data of the plurality of memory cells corresponding to the different threshold voltages.

6. The method of claim 5, wherein determining, by the controller, the valley voltage according to the scanning data of the plurality of memory cells corresponding to the different threshold voltages comprises:
   determining, by the controller, the counts of memory cells corresponding to the different threshold voltages according to the scanning data of the plurality of memory cells corresponding to the different threshold voltages; and
   determining, by the controller, a threshold voltage corresponding to the minimum count of memory cells in the preset threshold voltage interval as the valley voltage, according to the counts of memory cells corresponding to the different threshold voltages.

7. The method of claim 1, wherein the step of determining the valley voltage further includes determining a number of valley voltages, the number of the determined valley voltages being the same as a number of default read voltages of the memory.

8. An operation method of a memory system, the memory system including a controller and a memory coupled with each other, the memory including a plurality of memory cells, the method comprising:
   determining, by the controller, a read failure of target data;
   performing, by the controller, a plurality of read schemes sequentially, the plurality of read schemes including a read retry scheme, a soft decode read scheme, and an internal redundancy scheme RAID;
   after performing the internal redundancy scheme RAID, sending, by the controller, a first scanning command to the memory and determining a valley voltage by scanning the plurality of memory cells, wherein the valley voltage is determined according to counts of memory cells corresponding to different threshold voltages in a preset threshold voltage interval, the counts of memory cells corresponding to the different threshold voltages being obtained by scanning the plurality of memory cells, the valley voltage being a threshold voltage corresponding to the minimum count of memory cells in the threshold voltage interval;
   sending, by the controller, a first read command to the memory, the first read command being used for instructing the memory to use the valley voltage as a reference read voltage to read the target data; and
   reading, by the memory, the target data according to the valley voltage.

9. The method of claim 8, wherein after determining, by the controller, that the memory successfully reads the target data according to the first read command, the method further comprises:
   caching the determined valley voltage in the controller.

10. The method of claim 9, wherein after the caching the determined valley voltage in the controller, the method further comprises:
    calling, by the controller, the valley voltage, and sending a second read command to the memory, the second read command being used for instructing the memory to use the valley voltage as a reference read voltage to read the target data.

11. The method of claim 10, wherein after determining, by the controller, that the memory fails to read the target data according to the second read command, the method further comprises:
    sending, by the controller, a second scanning command to the memory and re-determining a valley voltage by scanning the plurality of memory cells.

12. The method of claim 8, wherein the determining the valley voltage by scanning the plurality of memory cells includes:
    determining, by the memory, different scanning voltages according to the first scanning command, the different scanning voltages including threshold voltages of the plurality of memory cells;
    outputting, by the memory, scanning information to the controller according to the first scanning command, the scanning information including scanning data of the plurality of memory cells corresponding to the different threshold voltages; and
    determining, by the controller, the valley voltage according to the scanning data of the plurality of memory cells corresponding to the different threshold voltages.

13. The method of claim 12, wherein determining, by the controller, the valley voltage according to the scanning data of the plurality of memory cells corresponding to the different threshold voltages includes:
    determining, by the controller, the counts of memory cells corresponding to the different threshold voltages according to the scanning data of the plurality of memory cells corresponding to the different threshold voltages; and
    determining, by the controller, a threshold voltage corresponding to the minimum count of memory cells in the preset threshold voltage interval as the valley voltage, according to the counts of memory cells corresponding to the different threshold voltages.

14. A memory system, comprising a controller and a memory coupled with each other, the memory including a plurality of memory cells;
    wherein the controller is configured to perform, upon a determination that a read failure of target data has happened, at least one read scheme selected from a plurality of read schemes, the plurality of read schemes including a read retry scheme, a soft decode read scheme, and an internal redundancy scheme RAID;
    the controller is further configured to send a first scanning command to the memory and determine a valley voltage by scanning the plurality of memory cells, the valley voltage is determined according to counts of memory cells corresponding to different threshold voltages in a preset threshold voltage interval, the counts of memory cells corresponding to the different threshold voltages being obtained by scanning the plurality of memory cells, the valley voltage being a threshold voltage corresponding to the minimum count of memory cells in the threshold voltage interval;
    the controller is further configured to send a first read command to the memory, the first read command being used for instructing the memory to use the valley voltage as a reference read voltage to read the target data;
    the memory is configured to read the target data according to the valley voltage; and
    the controller is further configured to. after determining that the memory successfully reads the target data according to the first read command, cache the determined valley voltage in the controller.

15. The memory system of claim 14, wherein the controller is further configured to:

perform sequentially the read retry scheme, the soft decode read scheme, and the internal redundancy scheme RAID.

16. The memory system of claim 14, wherein the controller is further configured to: after the caching the determined valley voltage, call the valley voltage and send a second read command to the memory, the second read command being used for instructing the memory to use the valley voltage as a reference read voltage to read the target data.

17. The memory system of claim 16, wherein the controller is further configured to: after determining that the memory fails to read the target data according to the second read command, send a second scanning command to the memory and re-determine a valley voltage by scanning the plurality of memory cells.

18. The memory system of claim 14, wherein the memory is further configured to determine different scanning voltages according to the first scanning command, the different scanning voltages including threshold voltages of the plurality of memory cells, the memory is further configured to output scanning information to the controller according to the first scanning command, the scanning information including scanning data of the plurality of memory cells corresponding to the different threshold voltages, and the controller is further configured to determine the valley voltage according to the scanning data of the plurality of memory cells corresponding to the different threshold voltages.

19. The memory system of claim 18, wherein the controller is configured to:

determine the counts of memory cells corresponding to the different threshold voltages according to the scanning data of the plurality of memory cells corresponding to the different threshold voltages; and determine a threshold voltage corresponding to the minimum count of memory cells in the preset threshold voltage interval as the valley voltage, according to the counts of memory cells corresponding to the different threshold voltages.

20. The memory system of claim 14, wherein the controller is further configured to determine a number of valley voltages, the number of the determined valley voltages being the same as a number of default read voltages of the memory.

* * * * *